(12) United States Patent
Chirko et al.

(10) Patent No.: US 8,389,962 B2
(45) Date of Patent: Mar. 5, 2013

(54) SYSTEM AND METHOD FOR COMPENSATING FOR MAGNETIC NOISE

(75) Inventors: Konstantine Chirko, Rehovot (IL); Alon Litman, Nes-Ziona (IL); Yoav Nachum, Kfar-Saba (IL)

(73) Assignee: Applied Materials Israel, Ltd., Rehovot (IL)

( * ) Notice: Subject to any disclaimer, the term of this patent is extended or adjusted under 35 U.S.C. 154(b) by 0 days.

(21) Appl. No.: 13/149,318

(22) Filed: May 31, 2011

(65) Prior Publication Data

US 2012/0305763 A1    Dec. 6, 2012

(51) Int. Cl.
*G11B 9/10* (2006.01)
*G01B 17/02* (2006.01)
*G06K 9/00* (2006.01)

(52) U.S. Cl. .......... 250/491.1; 250/251; 250/338.1; 250/396 ML; 250/492.2; 250/492.23; 315/5.13; 324/304

(58) Field of Classification Search ............ 250/251, 250/338.1, 396 ML, 491.1, 492.2, 492.23; 315/5.13; 324/304
See application file for complete search history.

(56) References Cited

U.S. PATENT DOCUMENTS

| | | | | |
|---|---|---|---|---|
| 3,433,944 A * | 3/1969 | George | ............... | 250/251 |
| 4,437,009 A * | 3/1984 | Yamazaki | ............... | 250/396 ML |
| 4,818,881 A * | 4/1989 | Tanton et al. | ............... | 250/338.1 |
| 5,465,012 A * | 11/1995 | Dunnam | ............... | 307/91 |
| 5,557,200 A * | 9/1996 | Coates | ............... | 324/303 |
| 5,998,797 A * | 12/1999 | Nakajima | ............... | 250/492.2 |
| 6,838,675 B2 * | 1/2005 | Harada et al. | ............... | 250/396 ML |
| 6,884,992 B1 | 4/2005 | Heiland | | |
| 7,359,305 B2 * | 4/2008 | Tsukuda et al. | ............... | 369/101 |
| 7,525,314 B1 | 4/2009 | Heiland | | |
| 7,525,893 B2 * | 4/2009 | Tsukuda et al. | ............... | 369/101 |
| 7,834,326 B2 * | 11/2010 | Kawasaki et al. | ............... | 250/396 ML |
| 7,872,240 B2 * | 1/2011 | Ito et al. | ............... | 250/396 R |
| 7,875,858 B2 * | 1/2011 | Ito et al. | ............... | 250/396 ML |
| 7,923,704 B2 * | 4/2011 | Sunaoshi | ............... | 250/492.23 |
| 7,947,964 B2 * | 5/2011 | Ito et al. | ............... | 250/396 ML |
| 7,994,786 B2 * | 8/2011 | Weaver et al. | ............... | 324/318 |
| 7,995,829 B2 * | 8/2011 | Ferro et al. | ............... | 382/141 |
| 8,000,203 B2 * | 8/2011 | Obara et al. | ............... | 369/101 |
| 8,178,840 B2 * | 5/2012 | Obuki et al. | ............... | 250/310 |
| 8,212,556 B1 * | 7/2012 | Schwindt et al. | ............... | 324/304 |
| 2002/0056813 A1 * | 5/2002 | Hartley et al. | ............... | 250/491.1 |
| 2004/0061066 A1 * | 4/2004 | Harada et al. | ............... | 250/396 ML |
| 2004/0166426 A1 * | 8/2004 | Tsukuda et al. | ............... | 430/30 |
| 2004/0211913 A1 * | 10/2004 | Petrov | ............... | 250/396 R |
| 2008/0116391 A1 * | 5/2008 | Ito et al. | ............... | 250/396 ML |
| 2008/0116807 A1 * | 5/2008 | Kim et al. | ............... | 315/5.13 |

(Continued)

OTHER PUBLICATIONS

European Patent Office, Extended Search Report for EP 11 179 310.5 (8 pg.) (Nov. 29, 2011).

*Primary Examiner* — David A Vanore
(74) *Attorney, Agent, or Firm* — Kilpatrick Townsend & Stockton LLP (57) ABSTRACT

A system and method for noise compensation of a charged particle beam location includes one or more sensors that are spaced apart from each other for sensing magnetic noises within at least one predefined frequency band thereby to provide magnetic noise measurements with synchronous detection of the location of a charged particle beam. Based on the magnetic noise measurements and on relationships between values of the magnetic noises and particle beam location errors, magnetic noise compensations signals are generated. An object is then scanned by a particle beam in response to a desired particle beam scan pattern and the magnetic noise compensation signals.

20 Claims, 9 Drawing Sheets

U.S. PATENT DOCUMENTS

2009/0059773 A1* 3/2009 Obara et al. ................ 369/126
2009/0173887 A1* 7/2009 Ito et al. ................ 250/396 ML
2011/0031969 A1* 2/2011 Kitching et al. .............. 324/304
2011/0273802 A1* 11/2011 Zhou et al. .................... 360/319

* cited by examiner

SYSTEM AND METHOD FOR COMPENSATING FOR MAGNETIC NOISE

FIELD OF THE INVENTION

The present invention generally relates to the field of noise cancellation and especially to cancellation of magnetic noises that affect particle beams.

BACKGROUND

Semiconductor wafers are manufactured by a highly complex manufacturing process that requires many manufacturing tools. A wafer can be transferred from one manufacturing tool to the other by an overhead hoist transport (OHT) system. A typical OHT system includes multiple OHT rails. The OHT rails include pairs of parallel conductors that are fed by alternating current (AC) signals. These AC signals generate magnetic fields that introduce errors in electron beam systems.

AC power supply systems also generate magnetic fields that introduce particle beam location errors.

SUMMARY OF THE INVENTION

A method for noise compensation of a particle beam, the method may include, according to an embodiment of the invention: sensing, by at least two sensors that are spaced apart from each other, magnetic noises within at least one predefined frequency band to provide magnetic noise measurements; generating magnetic noise compensation signals based on the magnetic noise measurements and on relationships between values of magnetic noises and particle beam location errors; and scanning an object by the particle beam in response to a desired particle beam scan pattern and the magnetic noise compensation signals.

The method may include defining or receiving an actual scan pattern such that the desired scan pattern may be obtained in the presence of the magnetic noises; and scanning the object by directing the particle beam along the actual scan pattern.

The method may include generating magnetic noise compensation signals that are substantially shifted by one hundred eighty degrees in relation to the noise signals.

The method may include delaying magnetic noise measurements by about one hundred eighty degrees to provide delayed signals and applying a gain function on the delayed signals to provide the noise compensation signals.

The method may include calculating magnetic noise compensation signals based on the magnetic noise measurements and on relationships between values of magnetic noises and particle beam location errors.

The method may include scanning, without applying noise compensation, a pattern of a known shape to obtain an actual image; and estimating the relationship between at least some values of magnetic noises and particle beam location errors based on differences between the known shape and the actual image.

The method may include scanning along a circular scan pattern, without applying noise compensation, a pattern that comprises two lines that are perpendicular to each other to obtain an actual image.

The method may include sensing magnetic noises within a first predefined frequency band by a first group of sensors that comprises at least one sensor; and sensing magnetic noises within a second predefined frequency band that differs from the first predefined frequency band by a second group of sensors that differs from the first group of sensors and comprises at least one sensor.

The method may include sensing magnetic noises by sensors that are positioned outside a particle beam column.

The method may include sensing magnetic noises by at least four sensors that have sensing regions that are spaced apart by about ninety degrees from each other.

The method may include sensing magnetic noises by sensors that are positioned in proximinty to difference facets of a frame of a tool that comprises a particle beam column.

The method may include detecting major sources of magnetic noises, and placing sensors so as to face the major sources of magnetic noises.

The method may include placing a sensor to face a group of adjacent major sources of magnetic noises.

The method may include sensing the magnetic noises within a predefined frequency band that comprises a 9 kHz frequency component.

The method may include sensing the magnetic noises within a predefined frequency band that comprises a frequency component of 50 Hz, 60 Hz, a harmonic of 50 Hertz or a harmonic of 60 Hz.

The method may include sensing the magnetic noises within a predefined frequency band that comprises frequencies of noises that are generated by an overhead hoist transport (OHT) system.

According to an embodiment of the invention, a system is provided and may include at least two sensors that are spaced apart from each other and arranged to sense magnetic noises within at least one predefined frequency band to provide magnetic noise measurements; a noise compensation module arranged to generate magnetic noise compensation signals based on the magnetic noise measurements and on relationships between values of magnetic noises and particle beam location errors; and a particle beam scanner arranged to scan an object by the particle beam in response to a desired particle beam scan pattern and the magnetic noise compensation signals.

The particle beam scanner may be arranged to receive an actual scan pattern such that the desired scan pattern is obtained in the presence of the magnetic noises; and to scan the object by directing the particle beam along the actual scan pattern.

The noise compensation module may be arranged to generate magnetic noise compensation signals that are substantially shifted by one hundred eighty degrees in relation to the noise signals.

The noise compensation module may be arranged to delay magnetic noise measurements by about one hundred eighty degrees to provide delayed signals and apply a gain function on the delayed signals to provide the noise compensation signals.

The noise compensation module may be arranged to calculate magnetic noise compensation signals based on the magnetic noise measurements and on relationships between values of magnetic noises and particle beam location errors.

The particle beam scanner may be arranged to scan, without applying noise compensation, a pattern of a known shape to obtain an actual image; and the noise compensation module may be arranged to estimate the relationship between at least some values of magnetic noises and particle beam location errors based on differences between the known shape and the actual image.

The particle beam scanner may be arranged to scan along a circular scan pattern, without applying noise compensation, a pattern that comprises two lines that are perpendicular to each other to obtain an actual image.

The system may include a first group of sensors that may be arranged to sense magnetic noises within a first predefined frequency band; and a second group of sensors arranged to sense magnetic noises within a second predefined frequency band that differs from the first predefined frequency band.

The system may include sensors that are positioned outside a particle beam column and are arranged to sense magnetic noises.

The system may include at least four sensors that have sensing regions that are spaced apart by about ninety degrees from each other.

The system may include sensors that are positioned in proximity to difference facets of a frame of a tool that comprises a particle beam column.

The system may include at least one sensor that may be arranged to sense the magnetic noises within a predefined frequency band that comprises a 9 kHz frequency component.

The system may include at least one sensor that may be arranged to sense the magnetic noises within another predefined frequency band that comprises a frequency component of 50 Hz, 60 Hz, a harmonic of 50 Hz or a harmonic of 60 Hz.

The system may include at least one sensor for sensing the magnetic noises within a predefined frequency band that comprises frequencies of noises that are generated by an overhead hoist transport (OHT) system.

A non-transitory computer readable medium that stores instructions for: sensing, by at least two sensors that are spaced apart from each other, magnetic noises within at least one predefined frequency band to provide magnetic noise measurements; generating magnetic noise compensation signals based on the magnetic noise measurements and on relationships between values of magnetic noises and particle beam location errors; and scanning an object by the particle beam in response to a desired particle beam scan pattern and the magnetic noise compensation signals.

The non-transitory computer readable medium can store instructions for at least one of the following or a combination thereof:
 a. Defining or receiving an actual scan pattern such that the desired scan pattern may be obtained in the presence of the magnetic noises; and scanning the object by directing the particle beam along the actual scan pattern.
 b. Generating magnetic noise compensation signals that are substantially shifted by one hundred eighty degrees in relation to the noise signals.
 c. Delaying magnetic noise measurements by approximately one hundred eighty degrees to provide delayed signals and applying a gain function on the delayed signals to provide the noise compensation signals.
 d. Calculating magnetic noise compensation signals based on the magnetic noise measurements and on relationships between values of magnetic noises and particle beam location errors.
 e. Scanning, without applying noise compensation, a pattern of a known shape to obtain an actual image; and estimating the relationship between at least some values of magnetic noises and particle beam location errors based on differences between the known shape and the actual image.
 f. Scanning along a circular scan pattern, without applying noise compensation, a pattern that comprises two lines that are perpendicular to each other to obtain an actual image.
 g. Sensing magnetic noises within a first predefined frequency band by a first group of sensors that comprises at least one sensor; and sensing magnetic noises within a second predefined frequency band that differs from the first predefined frequency band by a second group of sensors that differs from the first group of sensors and comprises at least one sensor.
 h. Sensing magnetic noises by sensors that are positioned outside a particle beam column.
 i. Sensing magnetic noises by at least four sensors that have sensing regions that are spaced apart by approximately ninety degrees from each other.
 j. Sensing magnetic noises by sensors that are positioned in proximate to difference facets of a frame of a tool that comprises a particle beam column.
 k. Detecting major sources of magnetic noises, and placing sensors such as to face the major sources of magnetic noises.
 l. Placing a sensor to face a group of adjacent major sources of magnetic noises.
 m. Sensing the magnetic noises within a predefined frequency band that comprises a 9 kHz frequency component.
 n. Sensing the magnetic noises within a predefined frequency band that comprises a frequency component of 50 Hz, 60 Hertz, a harmonic of 50 Hz or a harmonic of 60 Hz.
 o. Sensing the magnetic noises within a predefined frequency band that comprises frequencies of noises that are generated by an overhead hoist transport (OHT) system.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

According to an embodiment of the invention a system is provided. The system may include: (i) one or a number of sensors that are spaced apart from each other and are arranged to sense magnetic noises (within at least one predefined frequency band) to provide magnetic noise measurements; (ii) a noise compensation module arranged to generate magnetic noise compensation signals based on the magnetic noise measurements and on relationships between values of magnetic noises and particle beam location errors; (iii) a charged particle beam scanner arranged to scan an object by the particle beam in response to a desired particle beam scan pattern and the magnetic noise compensation signals that can include a control unit, particle beam source and particle beam deflectors, magnets, and the like.

The system may also include an imaging unit that can include imaging charged particle optics, particle detectors and monitors or another system that is sensitive to charged particle beam location.

The charged particle beam can be an ion beam or an electron beam. The system may be (or include) a scanning electron microscope (SEM), a critical dimension scanning electron microscope (CDSEM), an electron beam inspection (EBI) device, a transmitting electron microscope (TEM), a miller, or a combination thereof. The system can scan an object by using one or more charged particle beams. For simplicity of explanation it is assumed that the system uses a single electron beam.

The sensors may be spaced apart in order to sense magnetic fields that affect the particle beam and arrive from different directions. The system is usually proximate to multiple magnetic noise sources that are usually positioned at different locations and at different directions in relation to the system. For example, OHT rails can surround the system from four sides. The OHT rails are usually perpendicular to each other but this is not necessarily so.

The number of magnetic noise sources, their location in relation to the system, the strength of the magnetic noises and especially their impact on the location of the electron beam are hard to predict in advance and need to be sensed and evaluated during a calibration period. In order to be able to compensate for magnetic noise, the system should include a number of sensors that is not less than the number of noise sources. The sensors should be located such that each noise source is sensed by at least one sensor.

According to an embodiment of the invention a group of noise sources that produces equal response in all sensors can be regarded as a single noise source. Typically, the noise sources of such a group are located more closely to each other than to the system. Thus, a group of OHT rails that are substantially parallel to each other and are close to each other (or at least closer to each other than their distance to the system) can be regarded as a single noise source. The same applies to electrical power supply sources that are proximate to each other and may emit magnetic fields in the range of 50 Hz (or 60 Hz) and/or harmonics of this frequency. For simplicity of explanation the following explanations will refer to 50 Hz but it is applicable to harmonics of 50 Hz (or 60 Hz or harmonics of 60 Hz).

The location and number of sensors can be determined in advance (for example, by taking into account the most sensor-demanding scenario or taking into account less demanding scenarios). There is usually a hardware and/or cost limitation on the number of sensors and in some embodiments a system can always be equipped with a maximal number of sensors. According to other embodiments of the invention the number of sensors and their position may be tailored to the environment in which the system is expected to be placed. According to an embodiment of the invention redundant sensors can be provided and only those which face significant magnetic noise sources (such as OHT rails) may be read during the noise compensation process. Alternatively, all sensors may be read.

The distance between all spaced apart sensors may be the same but may also differ from one pair of sensors to another. The sensors may be positioned to face different directions. The angles between these facing directions can be equal to each other but may differ from one pair of facing directions to another. For example, M sensors may be positioned so that the angle between the facing directions of each pair of adjacent sensor is approximately (360/M) degrees. Yet for another example, the facing direction angle between at least one pair of sensors may differ from the facing direction angle between at least one other pairs of sensors.

Figure 1:
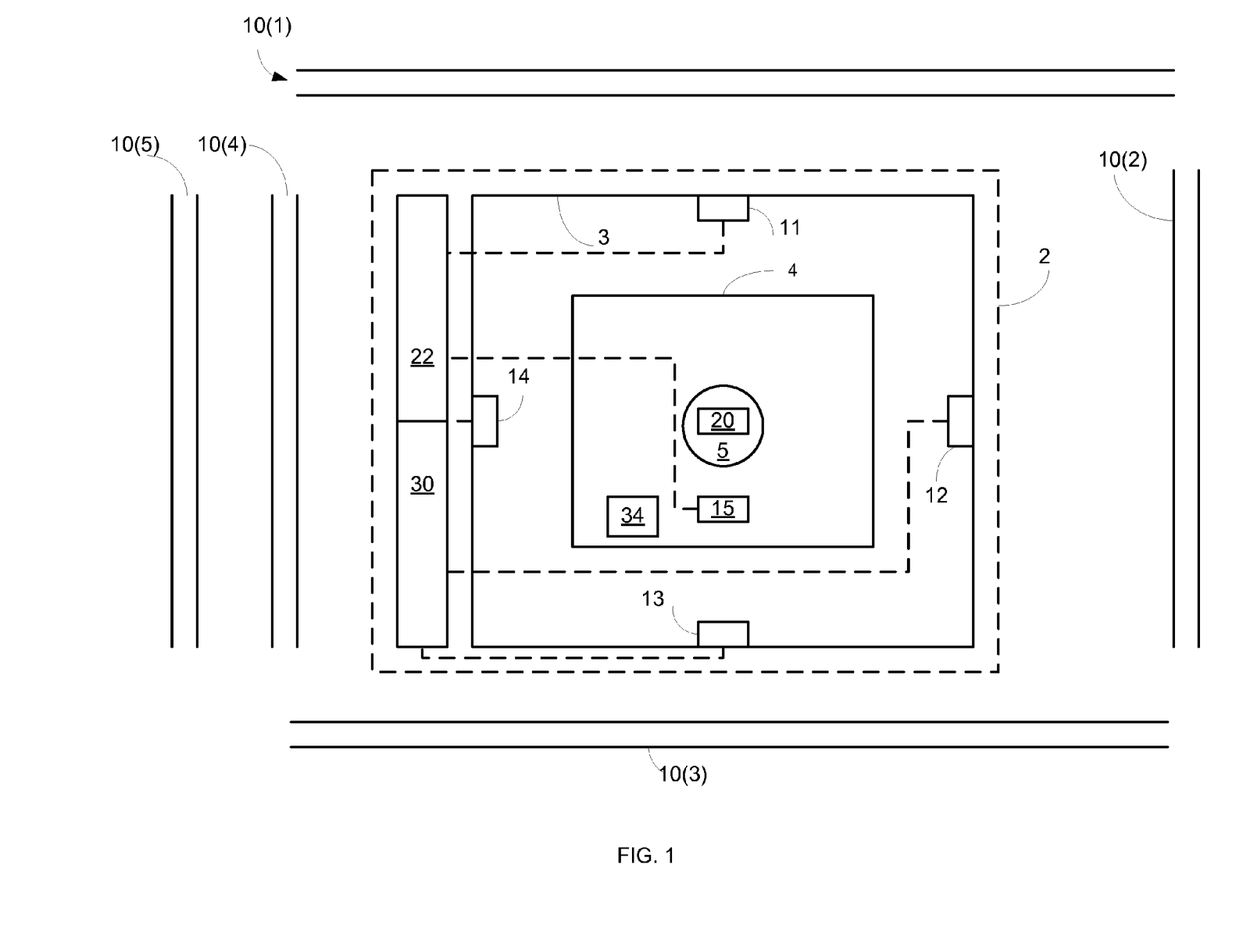
FIG. 1 illustrates a system and its environment according to an embodiment of the invention.
Figure 2:
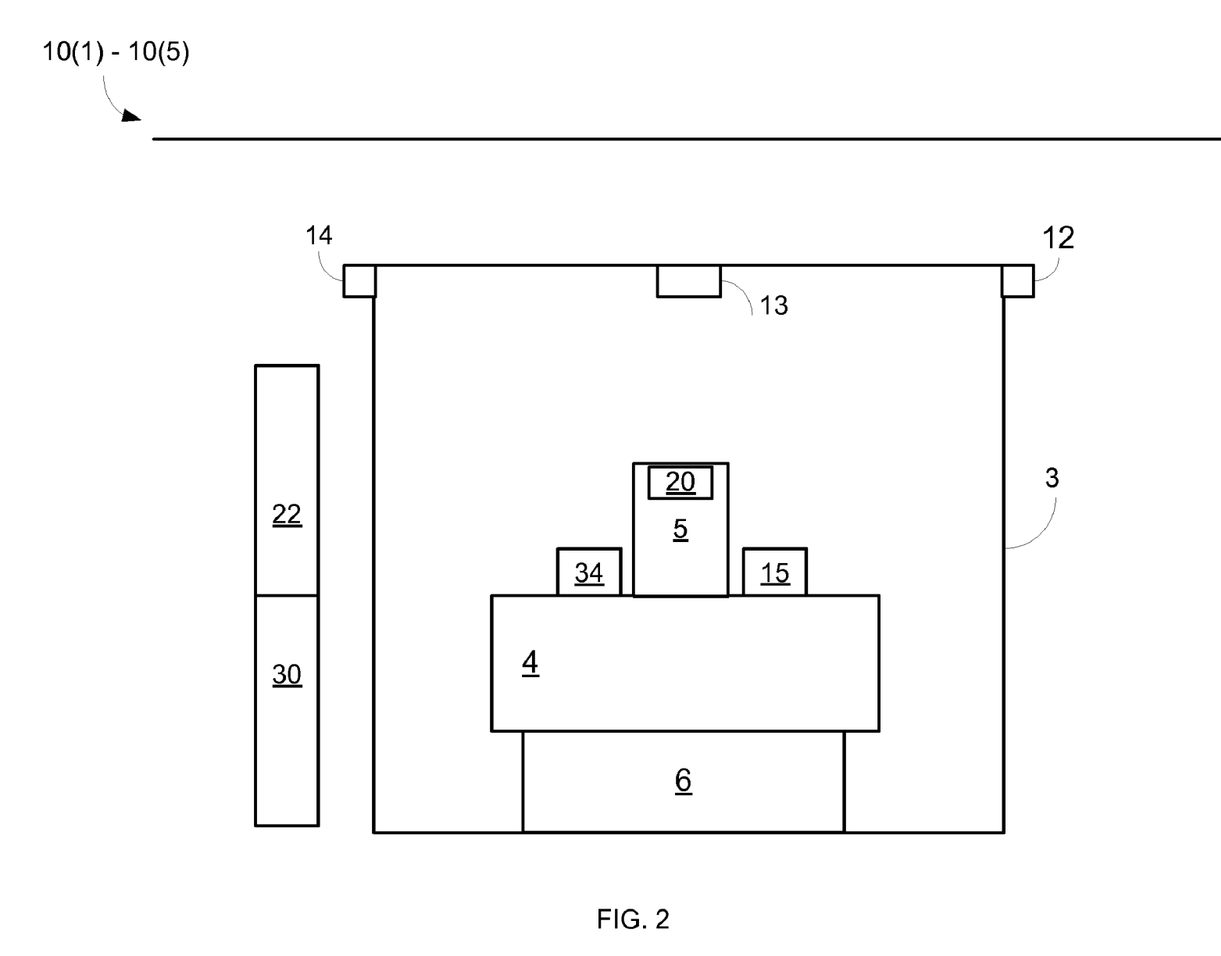
FIG. 2 illustrates a system and its environment according to another embodiment of the invention.
Figure 3:
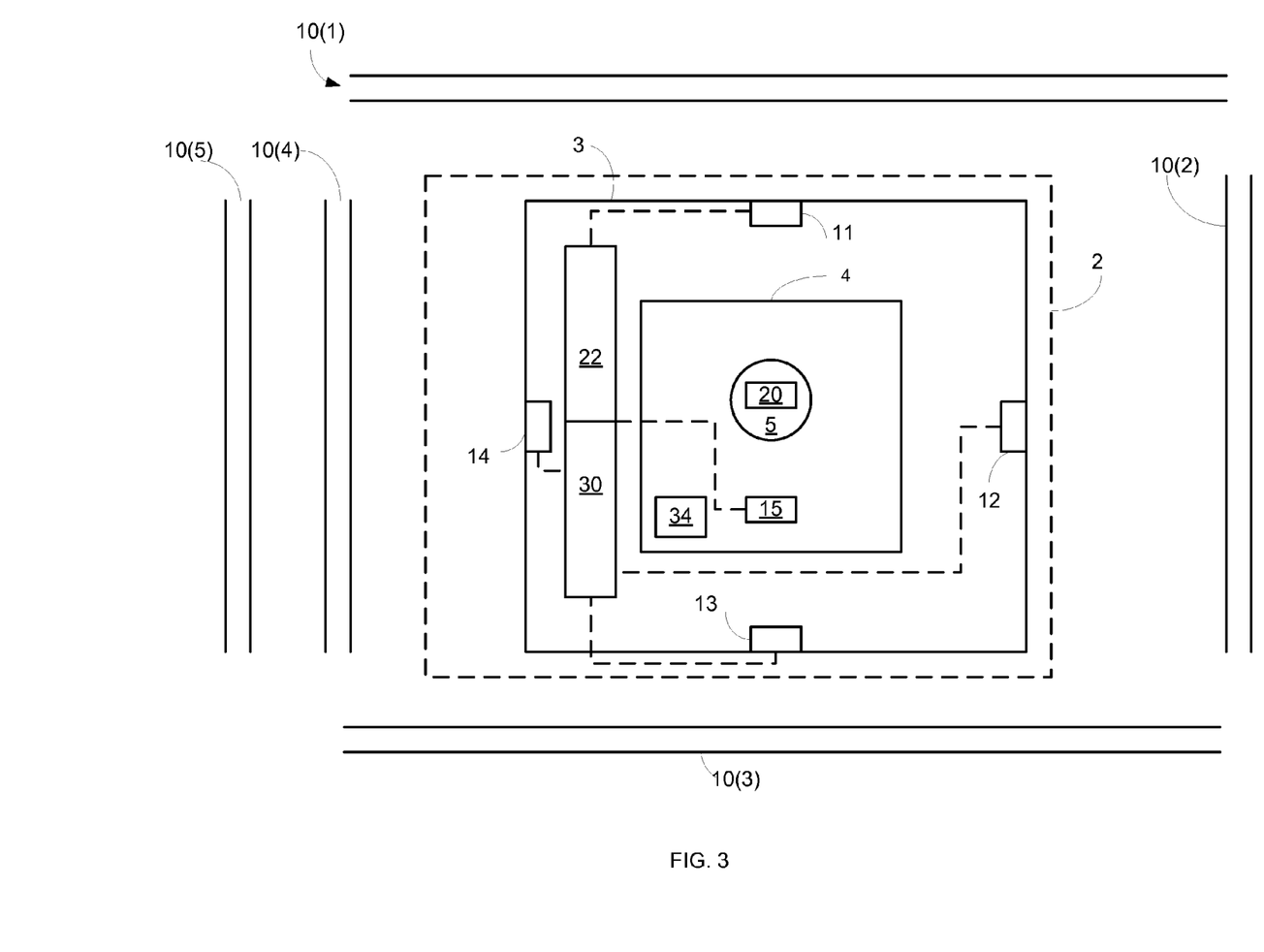
FIG. 3 illustrates a system and its environment according to a further embodiment of the invention.
Figure 4:
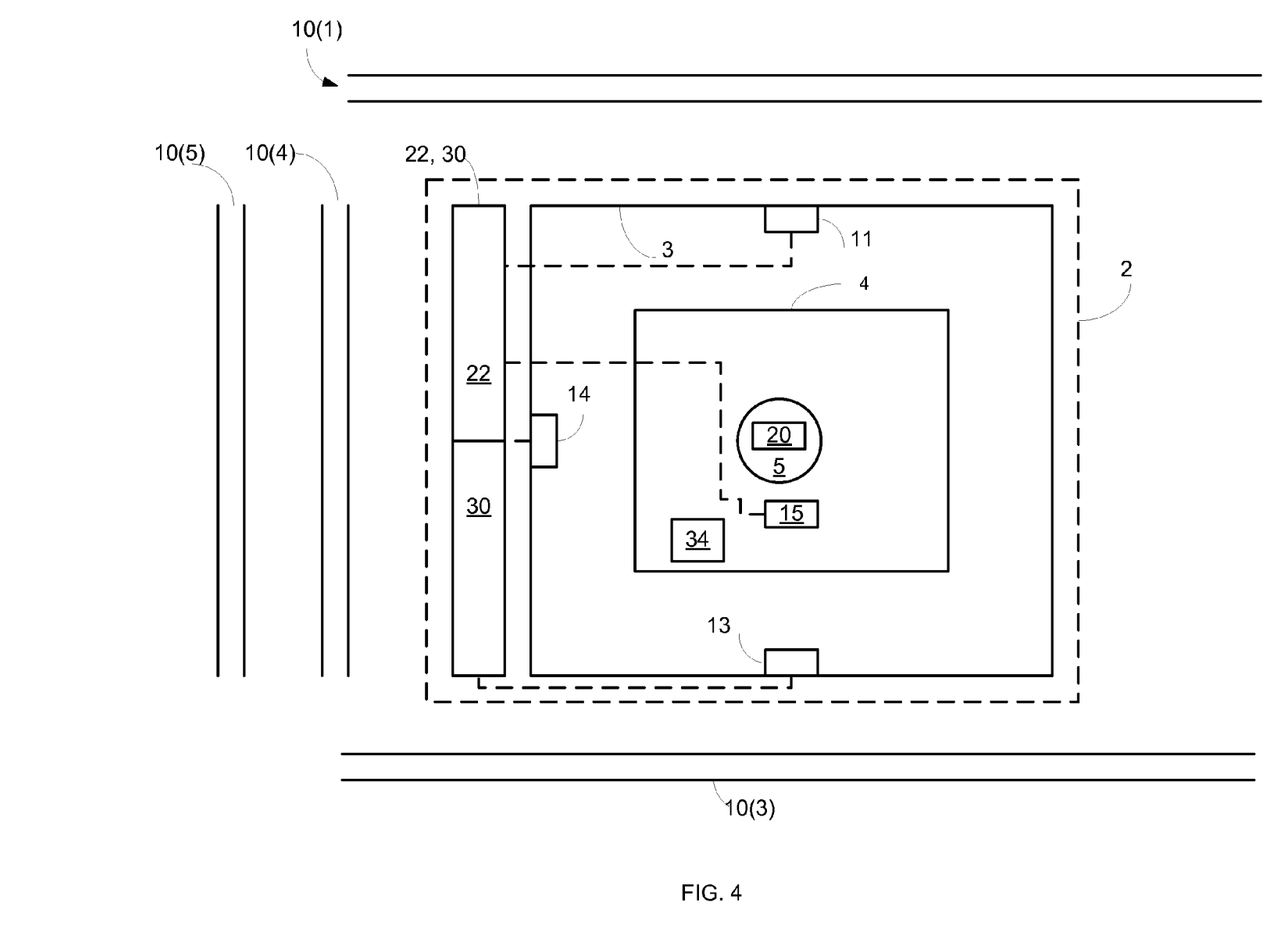
FIG. 4 illustrates a system and its environment according to yet a further embodiment of the invention.

An example of an even distribution of sensors is illustrated in FIGS. 1-3. Four sensors 11-14 for sensing OHT rail magnetic noises (M equals 4) face directions of zero degrees, 90 degrees, 180 degrees and 270 degrees. It is noted that the four sensors 11-14 can be positioned to face other directions—even some directions that are not perpendicular to each other. It is further noted that there can be more than four sensors, two sensors and even three sensors. A three OHT rail magnetic noise sensor configuration is illustrated in FIG. 4.

According to various embodiments of the invention different sensors can be allocated to sense magnetic noises in different frequency bands. Thus, a sensor can be arranged to sense magnetic noises in a single frequency band or can sense magnetic noises in more than a single frequency band. It is noted that a sensor can be tuned to sense magnetic signals in a single frequency band, can be followed by filters for filtering magnetic signals in one or more frequency bands and the like. Such filters can be an integral part of the sensor or be a separate entity. Accordingly, a sensor can be viewed as being arranged to sense magnetic signals in a frequency band if it (i) may be arranged to sense magnetic signals in the frequency band, (ii) it may be arranged to sense magnetic signals within a range that includes the frequency band but is wider than the frequency band but the sensor is followed by filter and, additionally or alternatively, its construction and/or principle of operation substantially ignores (or attenuates) information relating to frequencies outside the frequency band.

There may be provided multiple sensors arrays (groups)—a sensor array (group) including one or more sensors per frequency band. The arrays (groups) may differ from each other by the number of sensors, the position of the sensors and other sensor characteristics (such as sensitivity, dynamic range, sensing area and the like). In the example set fourth in FIGS. 1-3 there are four sensors 11-14 for sensing OHT rail magnetic noises and a single sensor 15 for sensing 50 Hz (or 60 Hz) noises.

According to an embodiment of the invention the charged particle beam propagates within a chamber 4, and additionally or alternatively within a column 5. The sensors can be located outside the chamber 4 or column 5 but this is not necessarily so. For example, one or more sensors can be positioned inside the chamber or column. Typically though, all the sensors are located outside the column 5 and chamber 4—either to address issues of cleanliness or size constraints or both.

FIG. 1 illustrates sensors 11-15 as being positioned outside column 5 and outside chamber 4. Each sensor out of sensors 11-14 is positioned in proximity to different respective facets of a first frame 3 of system 2.

OHT rails 10(1)-10(5) can be viewed as major sources of magnetic noises, and sensors 11-14 are positioned so as to face each of these major sources of magnetic noises.

The magnetic noise that is generated by a single magnetic noise source can be sensed by more than a single sensor. A sensor can sense the magnetic noises resulting from OHT rails that face the sensor as well as magnetic noises from one or more OHT rails that are oriented in other directions in relation to that sensor.

Referring to the example set forth in FIG. 1, sensor 11 faces OHT rail 10(1) and may sense the magnetic noise resulting from OHT rail 10(1) as well as sense magnetic noises from OHT rails 10(2), 10(4) and 10(5) that are perpendicular to OHT rail 10(1). Sensor 11 can also sense magnetic noises from OHT rail 10(3) that is parallel to OHT rail 10(1) but is located at the other side of system 2. The latter can be ignored due to shielding effects but may also be taken into account.

Referring to the examples set forth in FIGS. 1-4, a system 2 is provided. The system 2 may include sensors 11-15, chamber 4, column 5, controller 34, particle beam scanner 20, chassis 6, compensation function calculator 30 and noise compensation module 22. The object to be inspected or operated upon (not shown) may be placed on chassis 6, and can be moved by a mechanical stage or the like.

The sensors 11-14 can be arranged to sense OHT rail magnetic noises and sensor 15 may be arranged to sense magnetic noises generated by an electric power supply system.

The noise compensation module 22 can be arranged to generate magnetic noise compensation signals based on the magnetic noise measurements and on relationships between values of magnetic noises and particle beam location errors. These relationships can be estimated by the system 2 during a calibration period in which multiple magnetic noise measurements and multiple particle beam location errors are obtained. The noise compensation module 22 can be arranged to calculate these relationships based upon the obtained information.

According to an embodiment of the invention different OHT rails operate at different frequencies (even slightly different—for example by a fraction of a Hertz, by a few Hertz or more) and thus the magnetic noises interfere with each other to provide beats or other interference patterns. The magnetic noises can be obtained during multiple measurement iterations during one or more beat cycles. The frequency of the beat can be inversely proportional to a difference the frequencies of different OHT rails.

The noise compensation module 22 may provide the noise compensation signals to a particle beam scanner 20 that may be arranged to scan the object with the particle beam in response to a desired particle beam scan pattern (for example, a raster scan pattern, a spiral scan pattern or any other scan pattern) and the magnetic noise compensation signals.

The noise compensation module 22 or even the particle beam scanner 20 can define or receive an actual scan pattern such that the desired scan pattern is obtained in the presence of the magnetic noises. In other words, the actual scan pattern can deviate from the desired scan pattern while taking into account that such deviations will be countered (completely, substantially or partially) by the magnetic noises. The noise compensation signals can be delayed to be in anti-phase (substantially shifted by 180 degrees) to the error signals produced by magnetic noises and be amplified or attenuated so as to cancel (or at least greatly diminish) particle beam location errors resulting from the magnetic noises.

It is noted that FIGS. 1-2 and 4 illustrate the noise compensation module 22 as being located in proximity to the first frame 3 of system 2 although FIG. 3 illustrates the noise compensation module 22 as being included in (or at least partially surrounded by) the first frame 3.

A compensation function calculator 30 can calculate a compensation function that will compensate for magnetic noises and this compensation function may take into account the relationships between the values of magnetic noises and particle beam location errors. The compensation function calculator 30 can apply the compensation function on measured magnetic noises during the operation of the particle beam scanner 20. The compensation function can be represented by a matrix but other representations can be calculated. The compensation function can be an inverse function to a transfer function that represents the relationships between the magnetic noises and the particle beam location errors.

During a calibration period the compensation function calculator 30 can receive magnetic noise measurement signals from sensors 11-15 or can receive at least partially processed signals from noise compensation module 22. The compensation function calculator 30 can receive particle beam location errors or calculate the particle beam location errors based on images acquired during the calibration period.

In brief, the compensation function takes into account the phase and amplitude of magnetic noises generated by different magnetic noise sources. It especially takes into account the relationships between the values of magnetic noises (sensed by the sensors) and particle beam location errors. For example, the compensation function can take into account a phase error introduced by each noise source along two axes (such as orthogonal, planar X and Y axes) and an amplitude error introduced along these two axes.

During the calibration period the strength of one or more noise sources can be manipulated (for example, by increasing or decreasing the current that flows through OHT rails). It may be desired to independently change the characteristics of each noise source. Additionally or alternatively, the temporal value of the noise sources change over time and long enough calibration periods will provide enough information from which the influence of each noise source on each sensor can be evaluated.

A sensor may output a current that is proportional to the magnetic noises it senses. The values of currents generated by different sensors as well as the particle beam location errors they cause can be provided to a correlator that may determine the compensation function. Typically, the compensation function is calculated after a large number of magnetic noise measurements. The number of magnetic noise measurements usually exceeds a minimal requirement that equals the number of sensors multiplied by the number of magnetic noise sources that can affect each sensor multiplied by amplitude and phase.

The compensation function can be calculated (during a calibration period) once or more. It can be calculated when the system is installed in a manufacturing facility, when the environment of the system changes (for example, such as by adding or removing OHT rails), when the quality of images is reduced below a tolerable level, when particle beam location errors exceed a tolerable threshold, in response to any other event, in a periodic manner, in a pseudo-random manner, in a random manner, and the like.

The particle beam location errors can be evaluated or measured by scanning a known pattern and comparing the image so obtained with the known pattern. It is noted that other evaluations can be applied such as comparing images of the same pattern that were acquired at different times.

Figure 7:
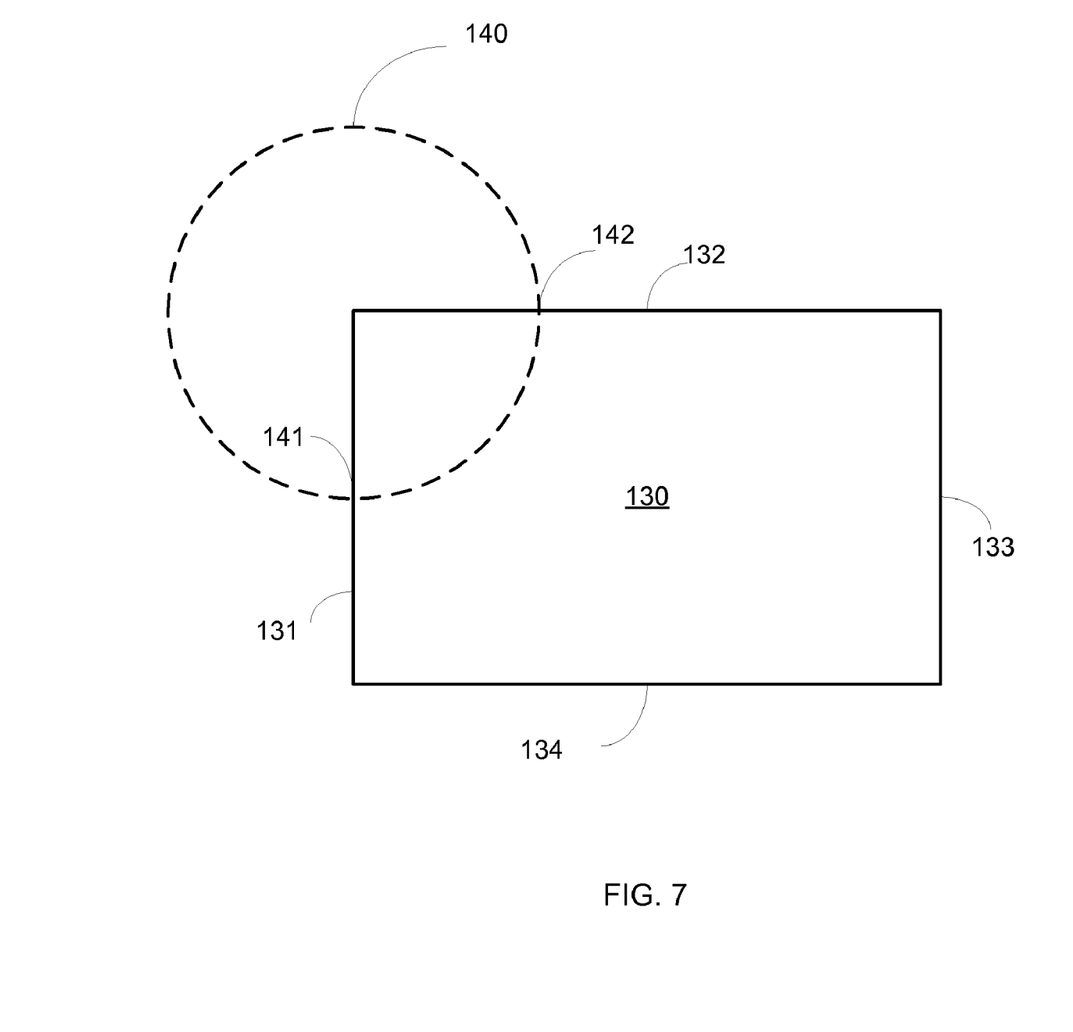
FIG. 7 illustrates a pattern and a scan pattern according to an embodiment of the invention.

According to an embodiment of the invention, X-axis particle beam location errors can be evaluated by scanning an edge or a line that is parallel to an imaginary Y-axis, and Y-axis particle beam location errors can be evaluated by scanning an edge or a line that is parallel to an imaginary X-axis (these X and Y axes being orthogonal to one another). Yet according to other embodiments of the invention both X-axis and Y-axis edges can be scanned at the same scanning iteration, for example by applying any kind of elliptical scan pattern that differs from a pure X-axis scan and a pure Y-axis scan. A circular scan pattern is illustrated in FIG. 7. The elliptical scan pattern can be linear, circular or fully elliptical. It is noted that multiple patters can be scanned during the calibration period.

FIG. 7 illustrates a rectangle 130 that has two horizontal facets 132 and 134 as well as two vertical facets 131 and 133. A circular scan pattern 140 crosses horizontal facet 132 at point 142 and crosses vertical facet 131 at point 141.

Without magnetic noises the locations of points 141 and 142 should be the same during each scan iteration, and these locations should comply with the known location of rectangle 130.

X-axis noises and Y-axis noises may change the location of points 141 and 142 in the obtained image. Such magnetic noises may also change the timing of edge detection (represented by points 141 and 142).

During operation (for example at measurement periods or milling periods that differ from calibration periods) the particle beam scanner 20 can be arranged to scan the object by directing the particle beam along the actual scan pattern. The particle beam scanner 20 can scan the particle beam multiple times, using the same desired scan pattern or different desired scan patterns. In each scan iteration the actual scan pattern can differ from the desired scan pattern in order to achieve (on the surface of the object) the desired scan pattern. For example, if a magnetic field modulates the particle beam to form a sinusoidal particle beam error then the actual scan pattern can include an inverse sinusoidal pattern that can cancel the undesired modulation.

The magnetic noise measurements obtained from the sensors 11-15 can be processed by applying various operations such as but not limited to filtering, analog to digital conversion, band pass filtering (including low pass filtering and/or high pass filtering), decimation, approximation and the like.

Figure 6:
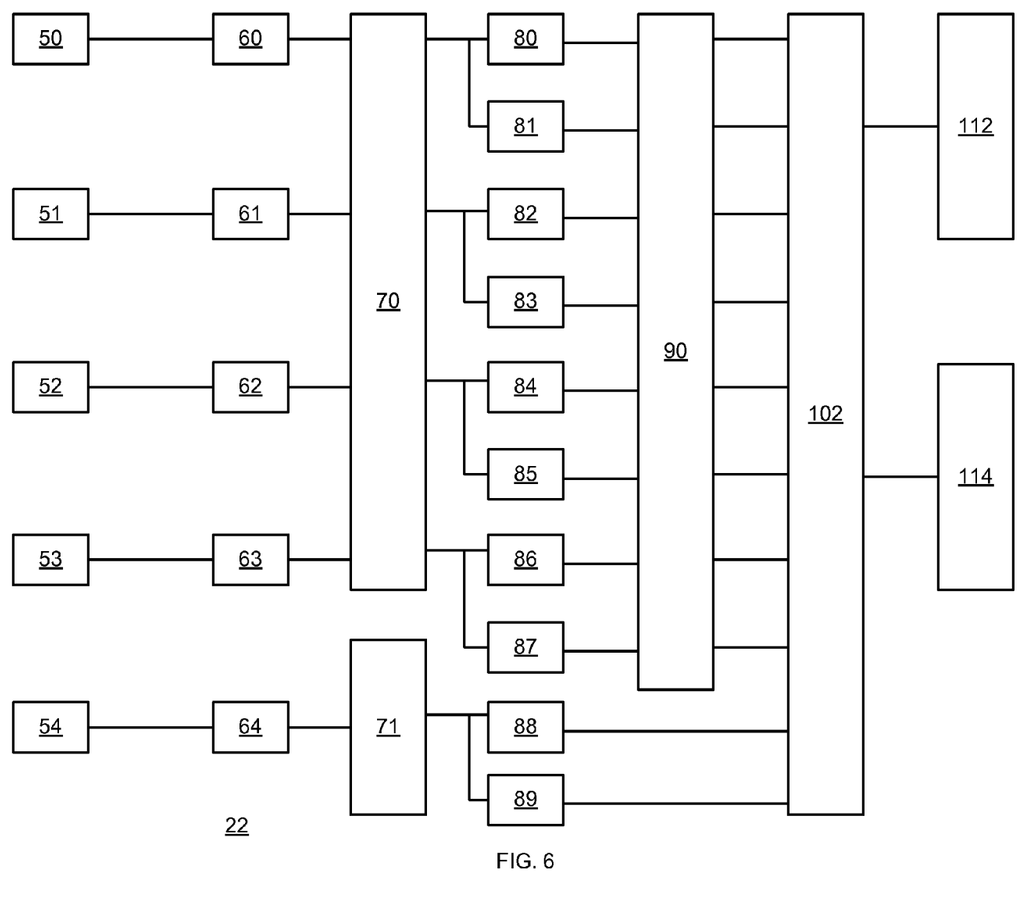
FIG. 6 illustrates a noise compensation module according to an embodiment of the invention.

FIG. 6 illustrates a noise compensation module 22 according to an embodiment of the invention.

Noise compensation module 22 includes analog to digital converters (ADCs) 50-54, band pass filters 60-64, storage units 70 and 71, delay units 80-89, matched filter 90, linear transformation matrix unit 102 and front end units 112 and 114.

ADCs 50-54 convert analog magnetic noise measurements from sensors 11-15 to digital magnetic noise measurements.

Digital magnetic noise measurements from ADCs 50-53 pass through 9 kHz band pass filters 60-63 while digital magnetic noise measurements from ADC 54 pass through 50 Hz band pass filter 64 to provide band pass filtered magnetic noise measurements. Each of these band pass filters can pass a narrow frequency band that may be centered at 9 kHz or 50 Hz, but this is not necessarily so. For example, a 9 kHz band pass filter can pass frequency components within a band that ranges between 8 and 10 kHz.

The band pass filtered magnetic noise measurements from 9 kHz band pass filters 60-63 are stored at storage unit 70 while the band pass filtered magnetic noise measurements from 50 Hz band pass filter 64 are stored at storage unit 71.

A single band pass filter may receive noise measurements from a single sensor. Band pass filtered magnetic noise measurements from the single band pass filter may be retrieved and provided to two delay units.

One delay unit is provided for compensating magnetic noises that are contributed by magnetic noise sources that face the single sensor while another delay unit is provided for compensating for magnetic noises that are contributed by magnetic noise sources that do not face the single sensor and may be perpendicular (or otherwise oriented) to the single sensor.

Assuming that the sensor 11 senses magnetic noises from X-axis oriented OHT rails 10(1) and from Y-axis oriented OHT rails 10(2), 10(4) and 10(5), then one delay unit (80) can be allocated for compensating magnetic noises from X-axis oriented OHT rails 10(1) and another delay unit (81) is allocated for compensating magnetic noises from Y-axis oriented OHT rails 10(2), 10(4) and 10(5).

Accordingly, a pair of delay units 80-89 is allocated for delaying the band pass filtered magnetic noise measurements from sensors 11-15—a pair of delay units per sensor. The output of the delay units is referred to as delayed magnetic noise measurements.

The delay period introduced by each delay unit is calculated during each calibration period. It is noted that during a calibration period the delay units can be set to provide zero delay or any other known delay period that will be taken into consideration when calculating the compensation function.

Matched filter 90 may receive delayed magnetic noise measurements from zero or all delay units. FIG. 6, for example, illustrates that a matched filter 90 receives delayed magnetic noise measurements from delay units 80-87. The matched filter can apply a filtering process that will compensate for measurement errors resulting from the sampling rate of the analog noise measurement signals by ADCs 50-54.

The output of the matched filter 90 and any delay units (88 and 89) that did not feed the matched filter 90 are provided to linear transformation matrix unit 102 that applies the compensation function to provide output signals.

These output signals are provided to front end units 112 and 114 the provide control signals to the particle beam scanner 20 in order to eliminate or greatly minimize the particle beam location errors. The control signals can be analog signals and the front end units can include digital to analog converters (DACs). Each front end unit can include an amplifier that amplifies an output signal (or an analog converted output signal) to provide the control signals.

The control signals output from the front end units 112 and 114 can be regarded as magnetic noise compensation signals.

The number of magnetic noise compensation signals output from the front end units 112 and 114 may depend on the manner in which the particle beam scanner 20 is controlled. If, for example, the particle beam scanner 20 is fed by an X-axis control signal and a Y-axis control signal then the front end units 112 and 114 will output an X-axis control signal and a Y-axis control signal.

Figure 5:
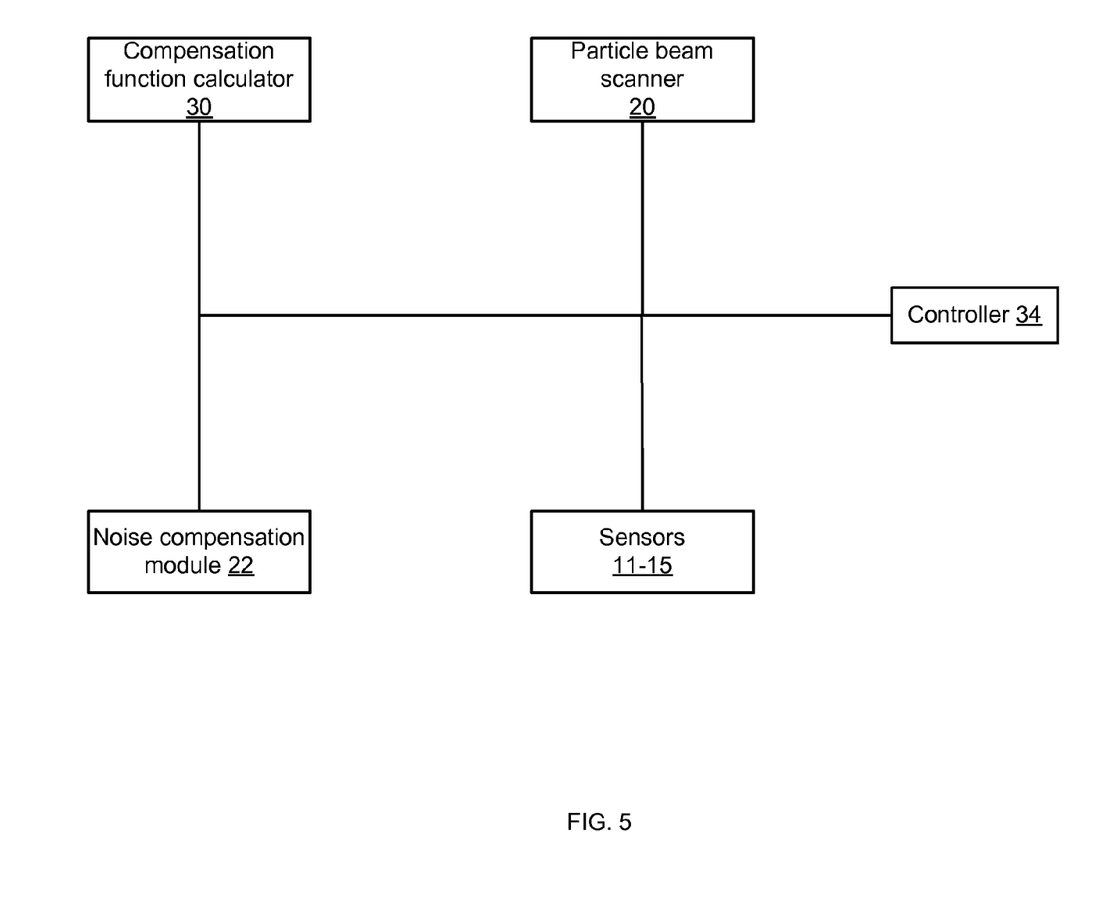
FIG. 5 illustrates some units of the system according to an embodiment of the invention.

As shown in FIG. 5, the particle beam scanner 20 can receive desired scan pattern control signals from controller 34, and also receive magnetic noise compensation signals from the noise compensation module 22 and in response scan the particle beam along an actual scan pattern that is responsive to all of these signals. The particle beam scanner 20 can add different control signals or apply any other mathematical function on these signals but this is not necessarily so.

According to an embodiment of the invention the sensors 11-15 have a bandwidth of 0-20 kHz and each can be utilized for 9 kHz and 50 Hz noise compensation. The system 2 can perform X-axis and Y-axis noise compensation for sensors 11-14 and X-axis, Y-axis and Z-axis (the Z axis being mutially orthogonal to both the X and Y axes) noise compensation for sensor 15.

The sampling rate of the noise measurement signals can be about 1 MHz. For the 50 Hz signal recording there is a need to perform decimation in order to include a sufficient number of cycles. For the 9 kHz signal recording, the sample rate will be similar to the input sampling rate.

FIG. 7 illustrates a pattern 130 and a scan pattern 140 according to an embodiment of the invention.

Pattern 130 is rectangle and includes an upper horizontal facet 132, a lower horizontal facet 134, a right vertical facet 133 and a left vertical facet 131. Scan pattern 140 is illustrated as an ideal circular scan pattern that intersects the upper horizontal facet 132 at a first intersection point 142 and intersects the left vertical facet at a second intersection point 141. In the absence of magnetic noise, repetitions of the scan pattern will result in the same results and the image may include small lines that represent the first and second intersection points. When magnetic noise appears and affects the scan pattern, deviations in the intersection points along the x-axis, the y-axis or both may result. These deviations will be cause the location of the intersection points in the images to deviate from the first and second (noiseless) deviation points. It is noted that other patterns and other scanning patterns can be applied.

Figure 8:
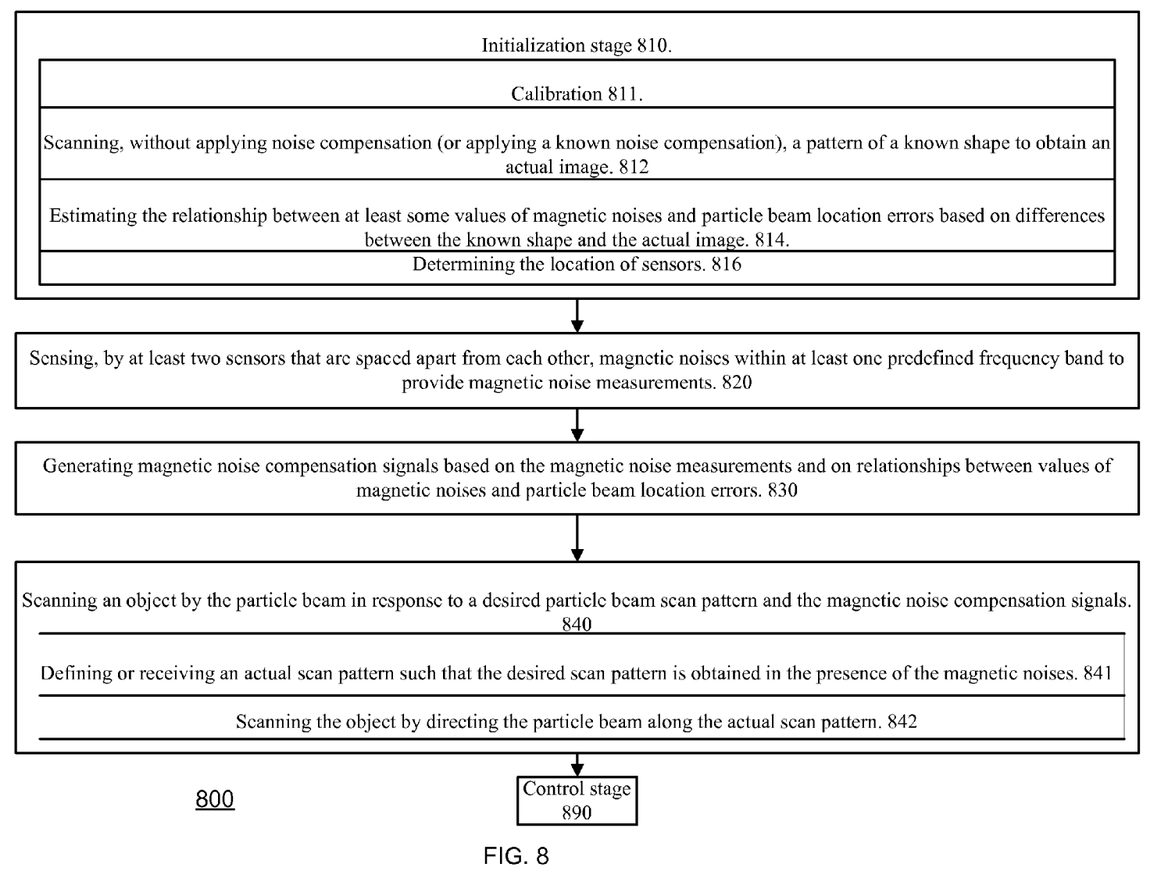
FIG. 8 illustrates a method according to an embodiment of the invention.

FIG. 8 illustrates a method 800 for noise compensation of a particle beam, according to an embodiment of the invention.

According to an embodiment of the invention method 800 can include receiving a compensation function representative of relationships between values of magnetic noises and particle beam location errors. Yet according to another embodiment of the invention method 800 includes calculating a compensation function representative of relationships between values of magnetic noises and particle beam location errors.

Method 800 is illustrated as including an initialization stage 810.

Stage 810 may include a calibration step 811 of receiving the compensation function, calculating the compensation function, and the like. Stage 810 can include locating sensors and the like.

Stage 810 may include, for example step 812 of scanning, without applying noise compensation (or applying a known noise compensation), a pattern of a known shape to obtain an actual image; and step 814 of estimating the relationship between at least some values of magnetic noises and particle beam location errors based on differences between the known shape and the actual image. Step 812 may include scanning along a circular scan pattern, without applying noise compensation, a pattern that may includes two lines that are perpendicular to each other to obtain an actual image. Stage 810 can include step 816 of determining the location of sensors. Step 816 may include detecting major sources of magnetic noises, and placing sensors so as to face the major sources of magnetic noises.

In brief, stage 810 may include calculating the compensation function by changing the strength of one or more noise sources. Additionally or alternatively, long enough calibration periods (enough samples) can provide the required number of samples.

Stage 810 may be followed by step 820 of sensing, by at least two sensors that are spaced apart from each other, magnetic noises within at least one predefined frequency band to provide magnetic noise measurements.

Step 820 can include at least one of the following: (a) sensing magnetic noises within a first predefined frequency band by a first group of sensors that may include at least one sensor; (b) sensing magnetic noises within a second predefined frequency band that differs from the first predefined frequency band by a second group of sensors that differs from the first group of sensors and may include at least one sensor; (c) sensing magnetic noises by sensors that are positioned outside a particle beam column; (d) sensing magnetic noises by at least four sensors that have sensing regions that are spaced apart by approximately ninety degrees to each other; (e) sensing magnetic noises by sensors that are positioned in proximity to difference facets of a frame of a tool that may include a particle beam column; (f) detecting major sources of magnetic noises, and placing sensors so as to face the major sources of magnetic noises; (g) sensing the magnetic noises within a predefined frequency band that may include a 9 kHz frequency component; (h) sensing the magnetic noises within a predefined frequency band that may include a 50 Hz frequency component; (i) sensing the magnetic noises within a predefined frequency band that may include frequencies of noises that are generated by a overhead hoist transport (OHT) system.

Step 820 is followed by step 830 of generating magnetic noise compensation signals based on the magnetic noise measurements and on relationships between values of magnetic noises and particle beam location errors.

Step 830 can include one or more processing operations such as filtering, delaying, amplifying, matrix calculation and the like. Step 830 may include for example, digital to analog conversion, band pass filtering, storing, retrieving, matched filtering, linear matrix transformation, delaying, amplifying and the like.

Figure 9:
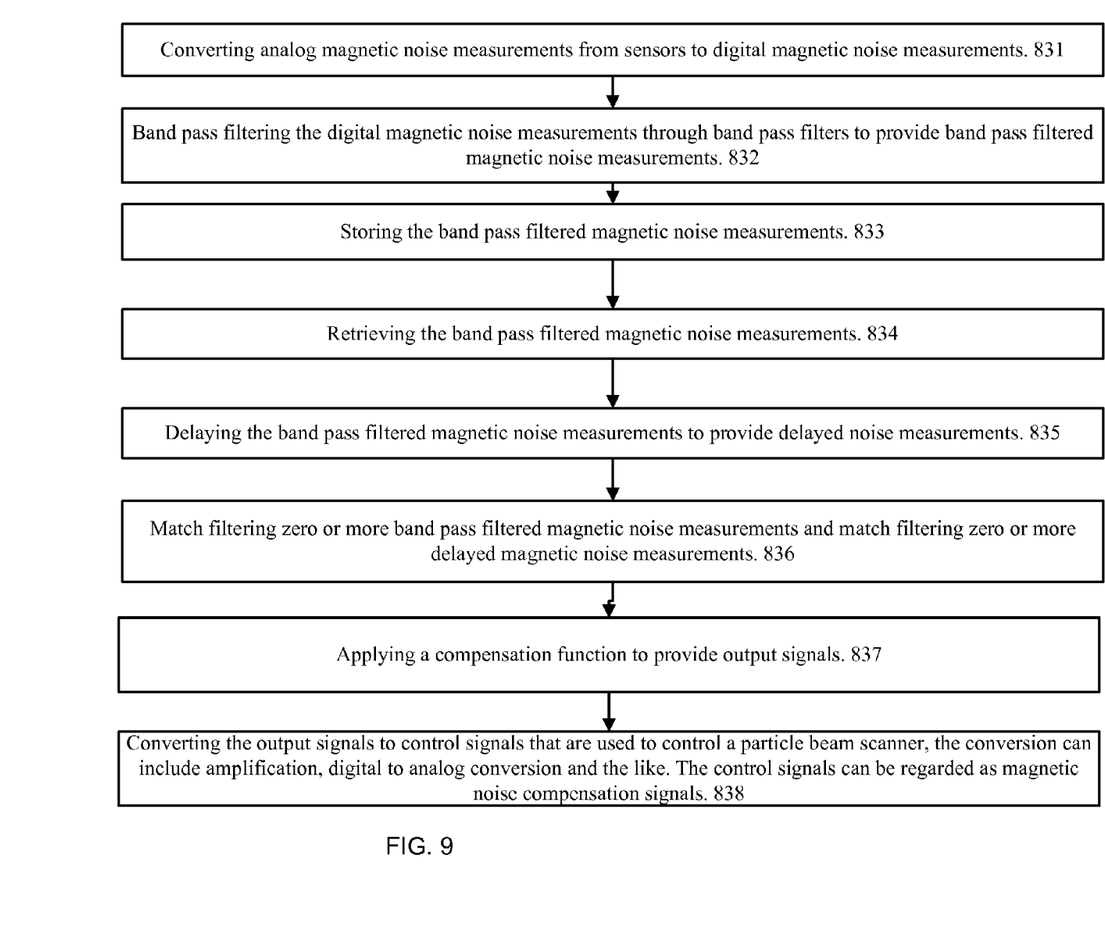
FIG. 9 illustrates a stage of the method according to an embodiment of the invention.

Step 830 may include, for example, at least some of the following steps, all of which are illustrated in FIG. 9:

a. Step 831 of converting analog magnetic noise measurements from sensors to digital magnetic noise measurements.

b. Step 832 of band pass filtering the digital magnetic noise measurements through band pass filters (for filtering predefined frequency bands) such as zero or more 9 kHz band pass filters and zero or more 50 Hez signals to provide band pass filtered magnetic noise measurements.

c. Step 833 of storing the band pass filtered magnetic noise measurements.

d. Step 834 of retrieving the band pass filtered magnetic noise measurements.

e. Step 835 of delaying the band pass filtered magnetic noise measurements to provide delayed noise measurements, wherein band pass filtered magnetic noise measurements from a single sensor can be delayed by zero or more delayed noise measurements.

f. Step 836 of match filtering zero or more band pass filtered magnetic noise measurements and match filtering zero or more delayed magnetic noise measurements.

g. Step 837 of applying a compensation function to provide output signals.

h. Step 838 of converting the output signals to control signals that are used to control a particle beam scanner, the conversion can include amplification, digital to analog conversion and the like. The control signals can be regarded as magnetic noise compensation signals.

Step 835 may include generating magnetic noise compensation signals that are substantially shifted by 180 degrees in relation to the noise signals.

Returing to FIG. 8, step 830 may be followed by stage 840 of scanning an object by the particle beam in response to a desired particle beam scan pattern and the magnetic noise compensation signals.

Stage 840 may include at least one out of:
a. Step 841 of defining or receiving an actual scan pattern such that the desired scan pattern is obtained in the presence of the magnetic noises.
b. Step 842 of scanning the object by directing the particle beam along the actual scan pattern.

Method 800 can also include a control stage 890 of determining when to repeat the calibration stage and re-calculating the compensation function.

Method 800 be executed by a processor that may execute instructions (code) stored in non-transitory computer readable medium such as a disk, a diskette, a tape, a storage unit, an integrated circuit and the like.

The non-transitory computer readable medium may store instructions for: sensing, by at least two sensors that are spaced apart from each other, magnetic noises within at least one predefined frequency band to provide magnetic noise measurements; generating magnetic noise compensation signals based on the magnetic noise measurements and relationships between values of magnetic noises and particle beam location errors; and scanning an object by the particle beam in response to a desired particle beam scan pattern and the magnetic noise compensation signals.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A method for noise compensation of a particle beam, the method comprising:
sensing, by at least two sensors that are spaced apart from each other, magnetic noises within at least one predefined frequency band to provide magnetic noise measurements;
generating magnetic noise compensation signals based on the magnetic noise measurements and on relationships between values of magnetic noises and particle beam location errors; and
scanning an object by the particle beam in response to a desired particle beam scan pattern and the magnetic noise compensation signals.

2. The method according to claim 1, further comprising:
defining or receiving an actual scan pattern such that the desired particle beam scan pattern is obtained in the presence of the magnetic noises; and
scanning the object by directing the particle beam along the actual scan pattern.

3. The method according to claim 2, further comprising delaying magnetic noise measurements by approximately one hundred eighty degrees to provide delayed signals and applying a gain function on the delayed signals to provide the magnetic noise compensation signals.

4. The method according to claim 1, wherein the magnetic noise compensation signals are generated so as to be substantially shifted by one hundred eighty degrees in relation to the magnetic noises.

5. The method according to claim 1, further comprising calculating the magnetic noise compensation signals based on the magnetic noise measurements and on relationships between values of magnetic noises and particle beam location errors before generating the magnetic noise compensation signals.

6. The method according to claim 1, further comprising:
scanning, without applying noise compensation, a pattern of a known shape to obtain an actual image; and
estimating a relationship between at least some values of the magnetic noises and the particle beam location errors based on differences between the known shape and the actual image.

7. The method according to claim 6, further comprising scanning along a circular scan pattern, without applying noise compensation, a pattern that comprises two lines that are perpendicular to each other to obtain the actual image.

8. The method according to claim 1, further comprising sensing the magnetic noises within a first predefined frequency band by a first group of sensors that comprises at least one sensor; and sensing the magnetic noises within a second predefined frequency band that differs from the first predefined frequency band by a second group of sensors that differs from the first group of sensors and comprises at least one sensor.

9. A system, comprising:
at least two sensors that are spaced apart from each other and arranged to sense magnetic noises within at least one predefined frequency band to provide magnetic noise measurements;
a noise compensation module arranged to generate magnetic noise compensation signals based on the magnetic noise measurements and on relationships between values of the magnetic noises and particle beam location errors; and
a particle beam scanner arranged to scan an object with a particle beam in response to a desired particle beam scan pattern and the magnetic noise compensation signals.

10. The system according to claim 9, wherein the particle beam scanner is arranged to receive an actual scan pattern such that the desired particle beam scan pattern is obtained in the presence of the magnetic noises; and to scan the object by directing the particle beam along the actual scan pattern.

11. The system according to claim 9, wherein the noise compensation module is arranged to generate magnetic noise compensation signals that are substantially shifted by one hundred eighty degrees in relation to the magnetic noises.

12. The system according to claim 11, wherein the noise compensation module is arranged to delay magnetic noise measurements by approximately one hundred eighty degrees to provide delayed signals and apply a gain function on the delayed signals to provide the noise compensation signals.

13. The system according to claim 9, wherein the noise compensation module is arranged to calculate magnetic noise compensation signals based on the magnetic noise measurements and on relationships between values of magnetic noises and particle beam location errors before generating the magnetic noise compensation signals.

14. The system according to claim 9, wherein the particle beam scanner is arranged to scan, without applying noise compensation, a pattern of known shape to obtain an actual image; and wherein the noise compensation module is arranged to estimate a relationship between at least some values of the magnetic noises and particle beam location errors based on differences between the known shape and the actual image.

15. The system according to claim 9, wherein the particle beam scanner is arranged to scan along a circular scan pattern, without applying noise compensation, a pattern that comprises two lines that are perpendicular to each other to obtain an actual image.

16. The system according to claim 9, comprising a first group of sensors that is arranged to sense the magnetic noises within a first predefined frequency band; and a second group of sensors arranged to sense the magnetic noises within a second predefined frequency band that differs from the first predefined frequency band.

17. The system according to claim 9, comprising at least four sensors that have sensing regions that are spaced apart by approximately ninety degrees from each other.

18. The system according to claim 9, wherein at least one sensor is arranged to sense the magnetic noises within a predefined frequency band that comprises a frequency component of 50 Hz, 60 Hz, a harmonic of 50 Hz or a harmonic of 60 Hz.

19. The system according to claim 9, wherein at least one sensor is configured for sensing the magnetic noises within a predefined frequency band that comprises frequencies of noises that are generated by a overhead hoist transport (OHT) system.

20. A non-transitory computer readable medium that stores computer-readable instructions for: sensing, by at least two sensors that are spaced apart from each other, magnetic noises within at least one predefined frequency band to provide magnetic noise measurements; generating magnetic noise compensation signals based on the magnetic noise measurements and on relationships between values of the magnetic noises and particle beam location errors; and scanning an object by a particle beam in response to a desired particle beam scan pattern and the magnetic noise compensation signals.

* * * * *